US008680894B1

(12) United States Patent
Inbar

(10) Patent No.: US 8,680,894 B1
(45) Date of Patent: Mar. 25, 2014

(54) PRECISION DRIVER CIRCUITS FOR MICRO-ELECTRO-MECHANICAL SYSTEM

(71) Applicant: Michael Inbar, Santa Barbara, CA (US)

(72) Inventor: Michael Inbar, Santa Barbara, CA (US)

(73) Assignee: Calient Technologies, Inc., Goleta, CA (US)

( * ) Notice: Subject to any disclaimer, the term of this patent is extended or adjusted under 35 U.S.C. 154(b) by 0 days.

(21) Appl. No.: 13/787,621

(22) Filed: Mar. 6, 2013

(51) Int. Cl.
*H03B 1/00* (2006.01)

(52) U.S. Cl.
USPC .......................................... 327/108; 327/112

(58) Field of Classification Search
None
See application file for complete search history.

(56) References Cited

U.S. PATENT DOCUMENTS

| | | | | |
|---|---|---|---|---|
| 6,628,041 | B2 | 9/2003 | Lee et al. | |
| 6,784,500 | B2 | 8/2004 | Lemkin | |
| 6,819,815 | B1 | 11/2004 | Corbalis et al. | |
| 6,922,499 | B2 | 7/2005 | Boie et al. | |
| 6,940,629 | B2 | 9/2005 | Gurcan | |
| 7,084,677 | B2 * | 8/2006 | Ferianz et al. | 327/108 |
| 7,215,527 | B2 * | 5/2007 | Neumann et al. | 361/233 |
| 7,227,385 | B2 | 6/2007 | Roessig, III et al. | |
| 7,670,015 | B2 | 3/2010 | Ide et al. | |
| 7,676,125 | B2 | 3/2010 | Zheng et al. | |

* cited by examiner

*Primary Examiner* — Cassandra Cox
(74) *Attorney, Agent, or Firm* — SoCal IP Law Group LLP; Steven C. Sereboff; John E. Gunther

(57) ABSTRACT

There is disclosed a driver circuits and method for driving a micro-electro-mechanical system. A driver circuit may include a converter to convert a digital input value into a pulse-width modulated signal with precise amplitude. A low pass filter may extract an average DC component of the pulse-width modulated signal. An amplifier may amplify the average DC component to provide an output voltage to drive the MEMS.

20 Claims, 7 Drawing Sheets

© 2013 Calient Technologies

© 2013 Calient Technologies

© 2013 Calient Technologies

© 2013 Calient Technologies

© 2013 Calient Technologies

© 2013 Calient Technologies

© 2013 Calient Technologies

© 2013 Calient Technologies

PRECISION DRIVER CIRCUITS FOR MICRO-ELECTRO-MECHANICAL SYSTEM

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to optical communications networks and more particularly to optical circuit switches using MEMS (micro-electromechanical system) mirror arrays.

2. Description of the Related Art

Communications networks commonly contain a mesh of transmission paths which intersect at hubs or nodes. At least some of the nodes may include a switching device that receives data or information arriving at the node and retransmits the information along appropriate outgoing paths.

Optical fiber links are commonly used to provide high bandwidth transmission paths between nodes. Such optical fiber links form the backbone of wide area networks such as the Internet. Optical fiber links are also applied in high bandwidth local area networks which may be used, for example, to connect server racks in large data centers or to connect processors in high performance computers.

An optical circuit switch is a switching device that forms connections between pairs of optical fiber communications paths. A typical optical circuit switch may have a plurality of ports and be capable of selectively connecting any port to any other port in pairs. Since an optical circuit switch does not convert information flowing over the optical fiber communication paths to electrical signals, the bandwidth of an optical circuit switch is essentially the same as the bandwidth of the optical communications paths. Further, since an optical circuit switch does not convert information into electrical signals, the power consumption of an optical circuit switch may be substantially lower than a comparable conventional (i.e. electronic) switch.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Figure 1:
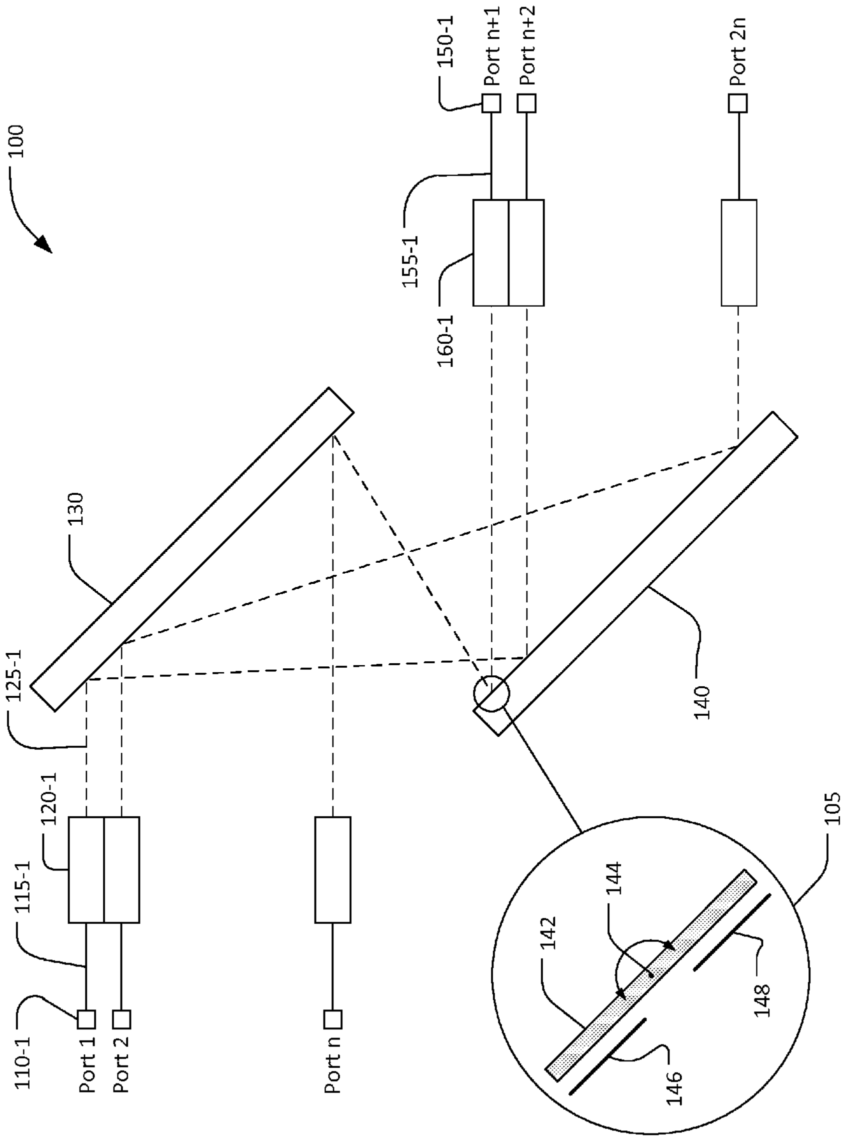
FIG. 1 PRIOR ART
FIG. 1 is an optical schematic diagram of an optical circuit switch.

Referring now to FIG. 1, an optical circuit switch 100 may be configured to connect a first group of n ports (where n is an integer greater than 1), labeled Port 1 to Port n, to a second group of n ports, labeled Port n+1 to Port 2n. More specifically, the optical circuit switch 100 may selectively connect up to n pairs of ports, where each pair of ports includes a port from the first group and a port from the second group. For ease of description, the first group of ports may be considered as input ports and the second group of ports may be considered as output ports. However, the optical circuit switch 100 may be capable of transferring optical signals in either direction between the first group of ports and the second group of ports.

Each of the input ports (Port 1 to Port n) may be a connector (of which only the connector 110-1 is identified) to receive an optical fiber cable (not shown). Each connector may be coupled by a respective optical fiber (of which only optical fiber 115-1 is identified) to a respective collimator lens (of which only collimator lens 120-1 is identified). Each collimator lens may convert an optical signal from the respective optical fiber into a collimated optical beam (of which only optical beam 125-1 is identified) in free space. Free space optical beams are shown in FIG. 1 as dashed lines.

Each free space optical beam, such as optical beam 125-1 may be directed onto a first mirror array 130. The first mirror array may include n mirrors with a one-to-one correspondence between optical beams and mirrors, such that each optical beam is directed onto a respective mirror. To improve the manufacturing yield of the first mirror array, the first mirror array 130 may include more than n mirrors, in which case the n optical beams may directed to a subset of n mirrors that are known to be fully functional.

Each mirror on the first mirror array 130 may direct the respective optical beam to a selected mirror of a second mirror array 140. The mirrors of the second mirror array 140 may direct the respective optical beam to a corresponding collimator lens (of which only collimator lens 160-1 is identified). Each collimator lens may focus the optical beam into a respective optical fiber (of which only optical fiber 155-1 is identified) that conveys the optical signal to a respective port connector (of which only connector 150-1 is identified).

The optical circuit switch 100 may create a one-to-one connection between any one input port and any one of the output port. For example, as shown in FIG. 1, Port 1 is connected to port n+2, port 2 is connected to port 2n, and port n is connected to port n+1.

The detail view 105 shows a simplified schematic diagram of a mirror from either the first mirror array 130 or the second mirror array 140. A reflective mirror element 142 is supported by a pair of torsion bars, of which only a first torsion bar 144 is visible. The second torsion bar is located on the far side of the mirror element 142 and axially aligned with the first torsion bar 144. The mirror element 142 may rotate about the axis of the torsions bars, with the torsion bars providing a spring force tending to return the mirror element 142 to a default position. The mirror element may be rotated by electrostatic attraction between the mirror element and either a first electrode 146 or a second electrode 148. For example, applying a voltage between the first electrode 146 and the mirror element 142 will create an attraction between the mirror element and the first electrode, causing the mirror element to rotate in a counter-clockwise direction. The mirror will rotate until the return force of the torsion bars is equal to the force of the electrostatic attraction. The angular rotation of the mirror element 142 may be approximately proportional to the square of the voltage between the first electrode 146 and the mirror element 142. Similarly, applying a voltage between the second electrode 148 and the mirror element 142 will cause the mirror to rotate in a clockwise direction.

In the simplified example of FIG. 1, the mirror element 142 rotates about a single axis defined by the torsion bars 144. Either or both of the first mirror array 130 and the second mirror array may include mirrors configured to independently rotate about two orthogonal axes. In this case, each mirror element may be coupled to a first pair of electrodes to cause clockwise and counter-clockwise rotation about a first axis and a second pair of electrodes to cause clockwise and counter-clockwise rotation about a second axis orthogonal to the first axis. The structure of a mirror array and the associated electrodes may be substantially more complex than that shown in the simplified schematic detail view 105. For example, U.S. Pat. No. 6,628,041 describes a MEMS mirror array having two-axis mirror motion and comb actuators.

Figure 2:
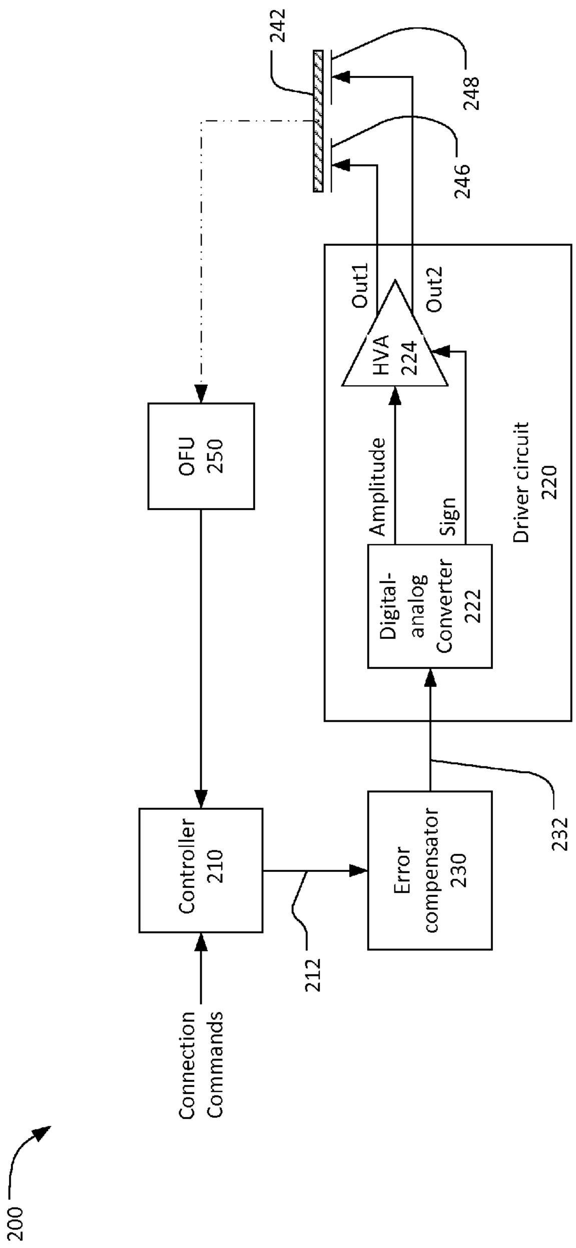
FIG. 2 is a block diagram of portions of an optical circuit switch.

FIG. 2 is a simplified block diagram of the control and mirror driver portions of an optical circuit switch 200, which may be the optical circuit switch 100. The optical circuit switch 200 may include a controller 210, an optical feedback unit (OFU) 250, and a plurality of mirror driver circuits 220. The optical circuit switch 200 may include one mirror driver circuit 220 for each mirror in two mirror arrays (e.g. mirror arrays 130 and 140 in FIG. 1) if the individual mirror elements are rotatable about a single axis. The optical circuit switch 200 may include two mirror driver circuits 220 for each mirror in the mirror arrays if the individual mirror elements are rotatable about two orthogonal axes. Each mirror driver circuit 220 may have two selectable outputs (Out1, Out2) to drive one or the other of a pair of electrodes 246, 248 coupled to a respective mirror 242.

The controller 210 may receive connection commands from an external source. Connection commands may be received, for example, from an operator via a graphical user interface coupled to the optical circuit switch 200. Connection commands may be received from a computing device that may, for example, supervise or manage a communications system or data center. Connection commands may be received from a computing device via a network connection or other communications link. A minimal set of connection commands may include, for example, "Break a-b" and "Make a-b". These commands may respectively instruct the optical circuit switch 200 to either break an existing connection between ports a and b (where a is an integer input port number and b is and integer output port number), or to make a new connection between ports a and b. The controller 210 may output a set of digital target voltage values 212 that, when applied to the appropriate electrodes of the two mirror arrays, will create or break the desired connection.

To determine the set of target voltage values 212, the controller may first extract port numbers from the connection command and then determine the mirrors coupled to the extracted port numbers. As previously described, to allow the use of mirror arrays having a small number of nonoperational mirrors, the number of mirrors in each mirror array may exceed the number of input or output ports. All input and output ports may be coupled to mirrors that are known to be operational based on component-level testing of the mirror arrays. The mirrors coupled to the extracted port numbers may be determined, for example, from a lookup table specific to the particular first and second mirror arrays used in the optical circuit switch 200.

When the controller 210 is making a new connection between two ports, the controller 210 may determine a set of nominal voltages that, when applied to the appropriate electrodes, will cause the mirrors associated with the two ports to rotate to create the desired connection. The controller 210 may derive the set of nominal voltages from the identities of the two ports. For example, given a pair of ports, the required rotation angle(s) for the mirrors associated with the two ports may be determined from the known geometry and relative position of the mirror arrays. Each rotation angle may then be converted to a voltage using a lookup table or a formula. The controller 210 may determine the set of nominal voltages from a mirror calibration table. For example, the mirror calibration table may store, for each possible pair of mirror numbers, a set of voltages that, when applied to the appropriate electrodes associated with the pair of mirrors, will cause the pair of mirrors to rotate to make the desired connection. The data in the mirror calibration table may be specific to the particular mirror arrays used in the optical circuit switch 200. The data in the mirror calibration table may be derived, for example, from the results of tests performed on the particular mirror arrays used in the optical circuit switch 200. The controller 210 may determine the set of nominal voltages in some other manner.

Some or all of the set of nominal voltage values may be adjusted in response to feedback received from the OFU 250. The controller 210 may use the feedback from the OFU 250 to optimize the voltage applied to some or all of the mirrors to minimize the insertion loss of each optical circuit. The OFU 250 may, for example, provide feedback to the controller 210 by indirectly measuring the position of each mirror by measuring the positions of probe beams reflected from the mirrors, as described in U.S. Pat. No. 6,819,815. The OFU 250 may provide feedback to the controller 210 by measuring the insertion loss of each optical circuit made by the optical circuit switch 200. For example, as described in U.S. Pat. No. 7,676,125, the OFU 250 may use a small number of optical power meters and a scanning optical system to periodically measure the insertion loss for each optical circuit. In this case, the OFU 250 may not continuously measure the insertion loss of each optical circuit, but instead may provide regular or periodic samples of the insertion loss of each circuit. The OFU 250 may provide feedback to the controller 210 in some other manner.

The controller 210 may output the set of target voltage values 212 including a target voltage value for each mirror driver circuit 220. Each target voltage value may be indicative of an analog voltage to be applied to one of the electrodes 246 and 248 coupled to each mirror driver circuit. For example, each target voltage value may be expressed in a signed-magnitude format, or a two's compliment format. In either case, a most significant bit of the digital value may be a sign bit. The sign bit may indicate which of the two electrodes 246, 248 should receive the analog voltage. For example, a negative sign bit may indicate that the voltage should be applied to electrode 246 to cause counter-clockwise (negative) rotation of the mirror 242. A positive sign bit may indicate that the voltage should be applied to electrode 248 to cause clockwise (positive) rotation of the mirror 242. The balance of the binary value, other than the sign bit, may indicate a magnitude of the voltage to be applied to the selected mirror.

Each driver circuit 220 may convert a respective voltage value from the set of target voltage values 212 to an analog voltage at level suitable for driving the respective mirror 242 in a MEMS mirror array. Each driver circuit 220 may include a digital to analog (D/A) converter 222 and a dual output high voltage amplifier (HVA) 224 having two selectable outputs (Out 1, Out2).

The rotation of the mirror 242 may not be a linear function of the voltage applied to the electrodes 246, 248. For example, the angle of rotation of the mirror 242 may be approximately proportional to the square of the applied voltage. In this case, when a relatively high voltage value is applied to an electrode, a small error in the applied voltage may cause an operationally significant departure from the intended mirror angle. While small errors in mirror position may be corrected in response to feedback via the OFU 250, larger errors may result in failed connections. To ensure that all connections are made, the translation of the target voltage values 212 from the controller into analog voltages applied to the electrodes of the mirror arrays may need to be very accurate. For example, voltages applied to the electrode of the mirror arrays may need to be accurate within ±100 millivolts or ±50 millivolts over a total output voltage range of 0 to 150 volts or more.

Even with best design practices and superior components, some or all of the driver circuits 220 may not be sufficiently accurate. For example, the D/A converter 222 may have linearity and/or amplitude errors and the HVA 224 may have offset voltage, gain, and or linearity errors. To ensure that the voltages applied to the mirror array electrodes are sufficiently accurate, the optical circuit switch 200 may include an error compensator 230 to compensate for errors in the driver circuits. The error compensator 230 may be effective to correct known errors in the driver circuits. The error compensator 230 may receive the set of target voltage values 212 from the controller 210 and may output a set of compensated voltage values 232 to the driver circuits 220. The compensated voltage values 232 may be derived from the target voltage values 212 such that, after conversion and amplification (with errors) by the driver circuits 220, the exact (or nearly exact) desired target voltages are applied to the electrodes of the mirror arrays.

Of course, in order to compensate for errors in the driver circuits, the errors in the driver circuits must be known. Each driver circuit may be characterized during manufacture of the optical circuit switch 200, and data describing the errors in each driver circuit may be stored in a memory within or coupled to the error compensator 230. For example, the error compensator 230 may include a look-up table that maps, for each driver circuit, target voltage values into compensated voltage values. Alternatively, the error compensator 230 may apply a mathematical equation to the target voltage value to determine the compensated value. For example, the compensated voltage value (CVV) 232 may be calculated from the equation:

$$\mathrm{CVV}=a+b(\mathrm{TVV})+c(\mathrm{TVV})^2 \quad (1)$$

where:

CVV=compensated voltage value;

TVV=target voltage value (212);

a, b, c=compensation coefficients determined by characterizing each driver circuit.

Each compensated voltage value 232 value may be converted to an analog voltage by the digital-to-analog (D/A) circuit. Conventional D/A circuits function by converting each digital bit into a weighted analog voltage or current and then summing the bit voltages or currents. Such D/A converters have unattractively high cost and power consumption for use in an optical circuit switch, where 1500 or more D/A circuits may be required. An alternative technique for converting a digital value to an analog voltage is to first convert the digital value to a binary pulse-width modulated (PWM) signal and then use a low pass filter to extract an average DC level from the PWM signal. This technique is commonly used, for example in motor controllers, where high bandwidth and extreme precision are not required.

Figure 3:
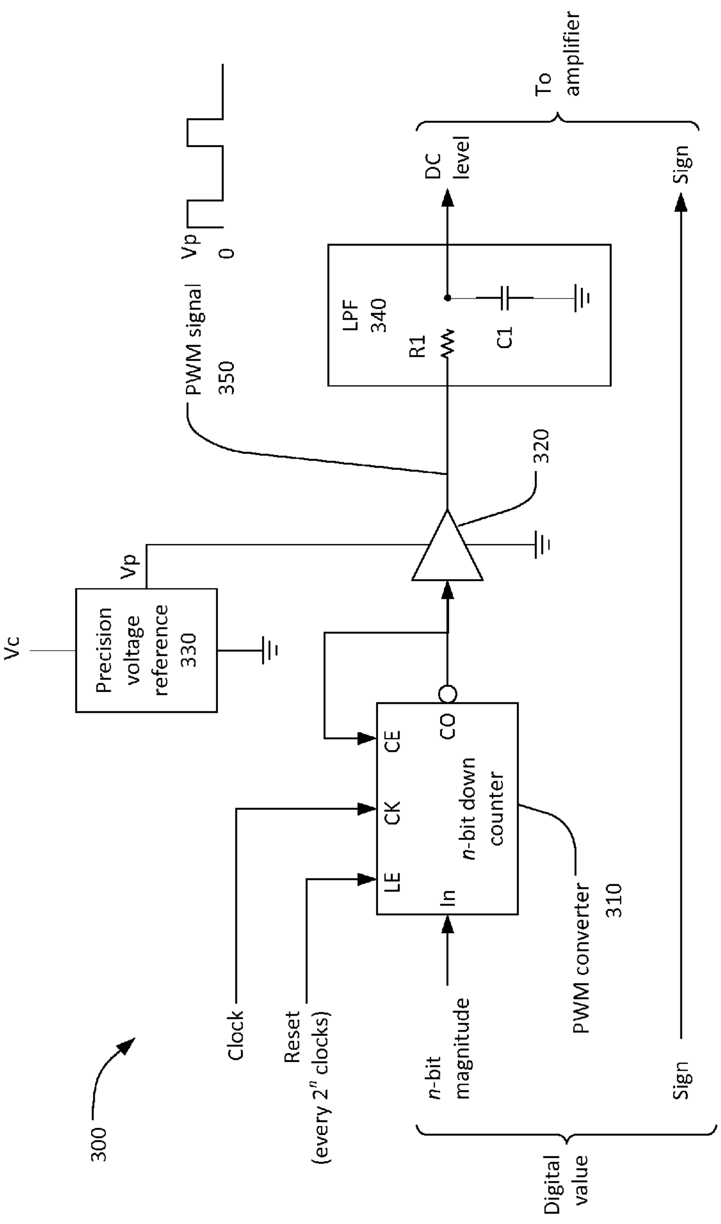
FIG. 3 is another block diagram of portions of an optical circuit switch.

Referring now to FIG. 3, a D/A converter 300 may be suitable for use as the D/A converter 222. The D/A converter 300 may include a PWM converter 310, a buffer 320, a precision voltage reference 330 and a low pass filter 340. In this example, the PWM converter 310 is implemented using an n-bit down counter, where n is a positive integer equal to the number of bits of the magnitude portion of a digital value. The down counter loads the n-bit magnitude on an active edge of a clock (CK) when a load enable input (LE) is high. When the LE input is low and a count enable input (CE) is high, the down counter counts down on each edge of the clock. When both the LE and CE inputs are low, the down counter retains its present value. The down counter provide an inverted carry out (CO) output that is low when the value of the counter is equal to zero, and high when the value of the counter is not zero. In this context, the terms “high” and “low” refer to logic levels, not necessarily to voltage values. A “low” logic level may be represented by a higher or lower voltage than a “high’ logic level.

To use the n-bit down counter as a PWM converter, the CO output is connected to the CE input, and the LE input is driven by a reset signal that is high for one clock cycle every $2^n$ clock cycles. The PWM converter 300 may receive a digital voltage value which, in this example, is assumed to include an n-bit magnitude and a sign bit (where n is an integer greater than 1). When the LE input is high, the n-bit magnitude is loaded into the down counter. On subsequent clock cycles, the down count counts down until the value in the counter is equal to zero. When the value reaches zero, the CO output and the CE input become low, and the counter retains the value zero until the n-bit magnitude is loaded on the next occasion of the reset signal. After the down counter is loaded in response to the reset signal, the CO output will be high for a number of clocks equal to the value of the n-bit digital magnitude and then low for the balance of the $2^n$ clock cycles. Thus the duty factor of the CO output is proportional to the n-bit digital magnitude. The use of the down counter is exemplary, and other circuits may be used to implement the PWM converter.

A PWM signal may be input to a low pass filter, such as LPF 340, having a time constant substantially larger than the period of the PWM signal. The LPF 340 may output a DC level proportional to the duty factor of the PWM signal. However, the DC level will also be proportional to the amplitude of the PWM signal. Thus, the amplitude of the PWM signal must be precise. In this context, the term “precise” means accurate to within a very small tolerance. “Precise” does not required absolute accuracy, but only very high accuracy consistent with available components and design practices. The precision must be sufficient to enable adjustment of mirrors with enough accuracy that the mirrors function so as to provide an optical connection between an input and output port. To this end, the CO signal from the PWM converter 310 may be input to a buffer circuit 320 that receives power from a precision voltage reference 330.

The precision voltage reference 330 may output a voltage Vp that has a nominal value, for example, of 3.2 volts or 5.0 volts and is accurate within a few millivolts. For example, commercially available precision 5.0 volt reference circuits have an initial voltage accuracy of 0.01% to 0.06% at a nominal temperature and a temperature coefficient of 0.6 parts-per-million/degree Centigrade (ppm/C.°) to 8.0 ppm/C.°. The precision voltage reference 330 may be, for example, a circuit known to those of skill in the art as a band gap reference, a buried zener diode reference, an XFET reference, or some other precision voltage reference circuit.

The buffer circuit 320 may be a non-inverting buffer as shown in FIG. 3, an inverter, a logic gate, or any other logical element. The buffer circuit 320 may be a separate component, as shown in FIG. 3, or may be incorporated into the PWM converter 310. The buffer circuit 320 may be, for example, a two-transistor complementary metal-oxide-semiconductor (CMOS) inverter. In this application, the CMOS inverter may effectively function as an analog switch that switches its output between ground and the voltage level provided by the precision voltage reference 330.

The PWM signal 350 output from the buffer circuit 320 may be filtered by the low pass filter 340 to provide a DC level. The DC level and the sign of the digital value may be input to a high voltage amplifier such as the HVA 224.

Figure 4:
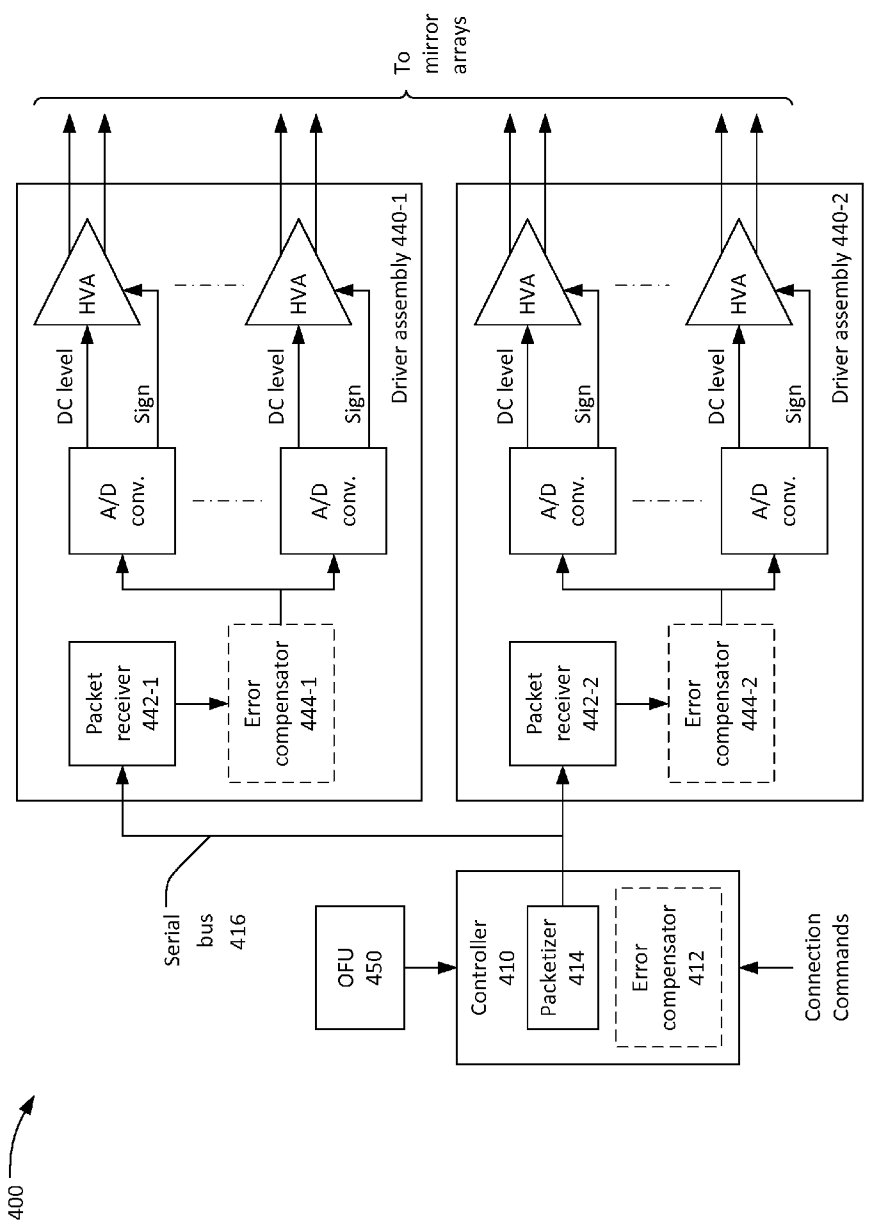
FIG. 4 is a block diagram of a data converter.

FIG. 4 is a simplified block diagram of the control and mirror driver portions of a large optical circuit switch 400, which may be capable of making connections between, for example, 300 or more input ports and 300 or more output ports. The optical circuit switch 400 may incorporate two MEMS mirror arrays (not shown), each having, for example, 350 or more mirrors that can be independently rotated on two orthogonal axes. A total of 1400 or more mirror driver circuits (i.e. two driver circuits per mirror) may be required to drive two MEMS mirror arrays. The optical circuit switch 400 may include a controller 410 coupled to an optical feedback unit (OFU) 450, and a plurality of driver assemblies 440-1 and 440-2. The use of two driver assemblies is exemplary, and an optical circuit switch may have more than two driver assemblies.

The controller 410 may determine voltages to be applied to electrodes in the mirror arrays based on connection commands and feedback from the OFU 450 as previously described. The controller 410 may send voltage values to the driver circuit assemblies 440-1, 440-2 over a serial bus 416. The serial bus 416 may be a standard serial bus such as an Inter-Integrated Circuit® (I2C) bus, a Universal Serial Bus® (USB), or a low-voltage differential signaling bus such as a Hyper Transport®, Fire Wire®, or RapidIO® bus. The serial bus 416 may use a proprietary bus architecture.

The controller 410 may include a packetizer 414 to format voltage values into packets for transmission over the serial bus 416. Each packet may include, for example, data identifying a particular mirror and one or two voltage values to be applied to the electrodes associated with the identified mirror. Each packet may include identifying information and voltage values for two or more mirrors. Each packet may include additional information such as a start sequence, data identifying a particular driver assembly, error compensation data, and/or an end sequence. Although not shown in FIG. 4, the serial bus 416 may be used for bidirectional communications between the controller 410 and the driver assemblies 440-1, 440-2.

Each driver assembly 440-1, 440-2 may include a packet receiver 442-1, 442-2 and a plurality of driver circuits. Each driver circuit may include a D/A converter, such as the D/A converter 300, and a dual output high voltage amplifier. Each packet receiver 442-1, 442-2 may receive packets from the controller 410 via the serial data but 416. Each packet receiver may extract voltage values and associated mirror identities from the received packets. The voltage values may be provided to the respective driver circuits.

As previously described, even with best design practices and best available components, the driver circuits may not be sufficient accurate. Thus the optical circuit switch 400 may compensate for the driver circuit errors. Error correction may be performed by error compensators 444-1, 444-2 within the driver assemblies 440-1, 440-2. In this case, uncorrected target voltage values may be packetized and transmitted to the driver assemblies 440-1, 440-2 over the serial bus 416. Error correction may be performed by an error compensator 412 within or coupled to the controller 410. In this case, corrected voltage values may be packetized and transmitted to the driver assemblies 440-1, 440-2 over the serial bus 416. In either case, error correction may be accomplished using a lookup table, an algorithm, or in some other manner. Error correction may be distributed between the error compensator 412 within or coupled to the controller 410 and the error compensators 444-1, 444-2 within the driver assemblies 440-1, 440-2.

Figure 5:
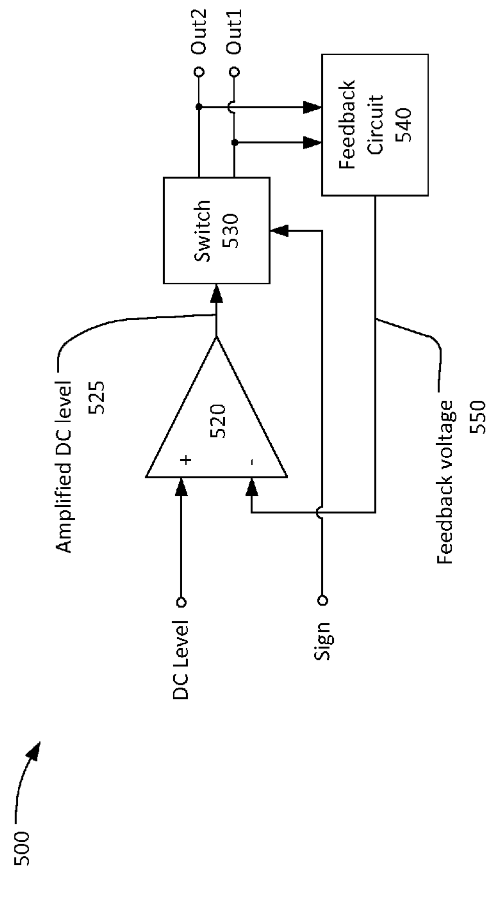
FIG. 5 is a block diagram of a circuit for driving a mirror in a mirror array.

Referring now to FIG. 5, a high voltage amplifier (HVA) 500 may be suitable for driving MEMs mirror arrays in optical circuit switches such as the optical circuit switches 100, 200, and 400. Specifically, the HVA 500 may be suitable for driving a selected one of a pair of electrodes to cause an associated mirror to rotate in either a clockwise or counter-clockwise direction. The HVA 500 may include an amplifier 520, a switch 530, and a feedback network 540. The amplifier 520 may input a DC level and generate an amplified DC level 525. The switch 530 may connect the output of the amplifier 520 to either of a first output (Out1) or a second output (Out2). The feedback network 540 may generate a feedback voltage 550 based on the voltage at the selected output Out1, Out2. The feedback voltage 550 may be input to the amplifier 520. The amplifier 520 may set the voltage at the selected output Out 1, Out2 such that the feedback voltage 550 becomes equal to the DC Level. Since the feedback voltage 550 is derived from the output (Out 1 or Out 2) selected by the switch 530, the characteristics of the switch 530 (e.g. impedance, offset voltage, etc.) may not affect the accuracy of the voltage provided at the selected output.

Figure 6:
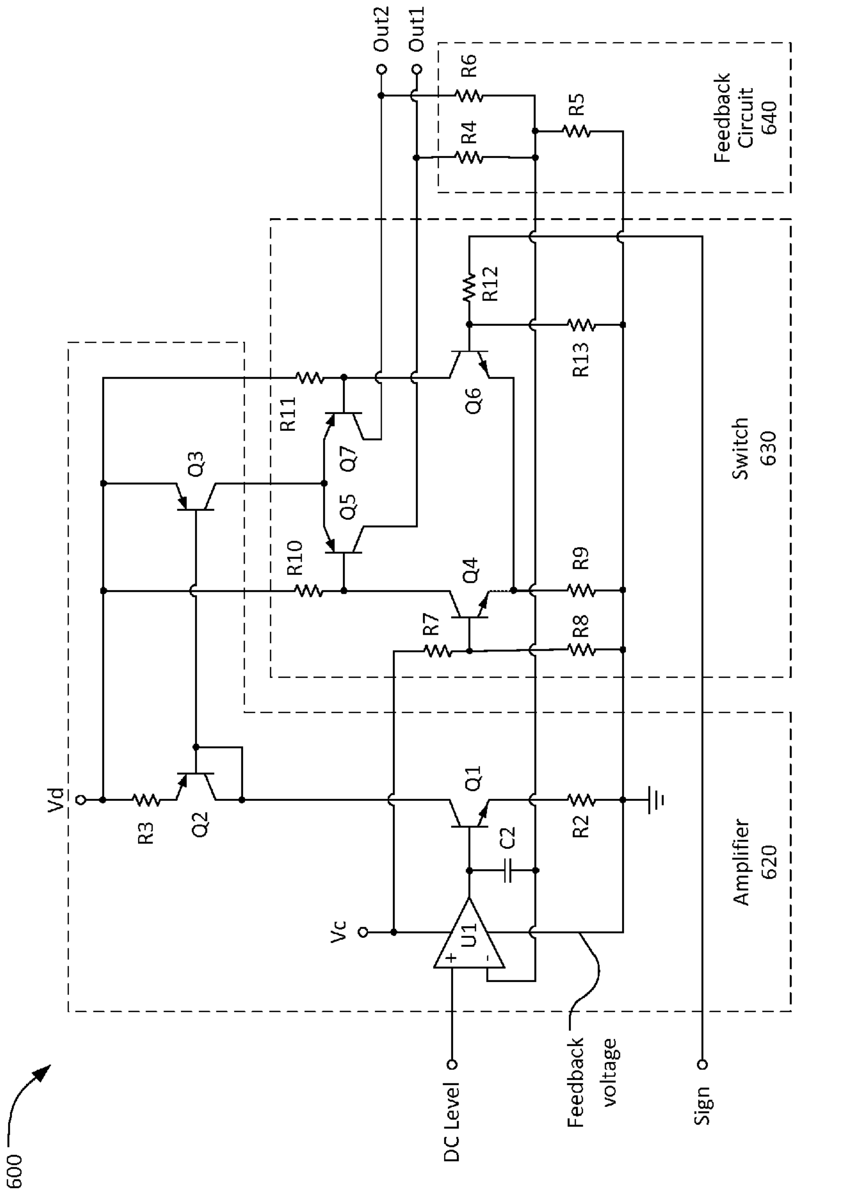
FIG. 6 is a schematic diagram of a circuit for driving a mirror in a mirror array.

FIG. 6 is a schematic diagram of a high voltage amplifier (HVA) 600 which is an exemplary implementation of the HVA 500. The HVA 600 includes an amplifier 620, a switch 630, and a feedback network 640. The amplifier 600 is implemented using bipolar transistors. A similar amplifier may be implemented using field effect transistors or a combination of bipolar and field effect transistors. The amplifier 600 may be implemented using discrete components, integrated circuits, or a combination thereof. The amplifier 600 may be implemented on a printed wiring board, as a hybrid circuit, or as a fully integrated circuit.

The amplifier 620 includes an integrated operational amplifier U1, a level translator (Q1, Q2, R2, R3), and a common-emitter transistor amplifier Q3. Capacitor C2 may limit the bandwidth of the amplifier 620 to ensure stability and further low pass filter the DC level.

The switch 630 may connect the collector of transistor Q3 to either Out 1 or Out 2. When the Sign signal is low (e.g. near ground), transistors Q6 and 7 are turned off and transistors Q4 and Q5 are turned on, thus connecting the collector of transistor Q3 to Out 1. When the Sign signal is high (e.g. greater than the voltage at the base of transistor Q4), transistors Q6 and 7 are turned on and transistors Q4 and Q5 are turned off, thus connecting the collector of transistor Q3 to Out 2.

The feedback network 640 may generate a feedback voltage from the voltage at the selected output Out1, Out2. When the Sign signal is low and the collector of transistor Q3 is connected to Out 1, resistors R4 and R5 serve as the load on transistor Q3 and as a voltage divider to provide the feedback voltage to the input of operational amplifier U1. When the Sign signal is high and the collector of transistor Q3 is connected to Out 2, resistors R6 and R5 serve as the load on transistor Q3 and as a voltage divider to provide the feedback voltage to the input of operational amplifier U1.

Description of Processes

Figure 7:
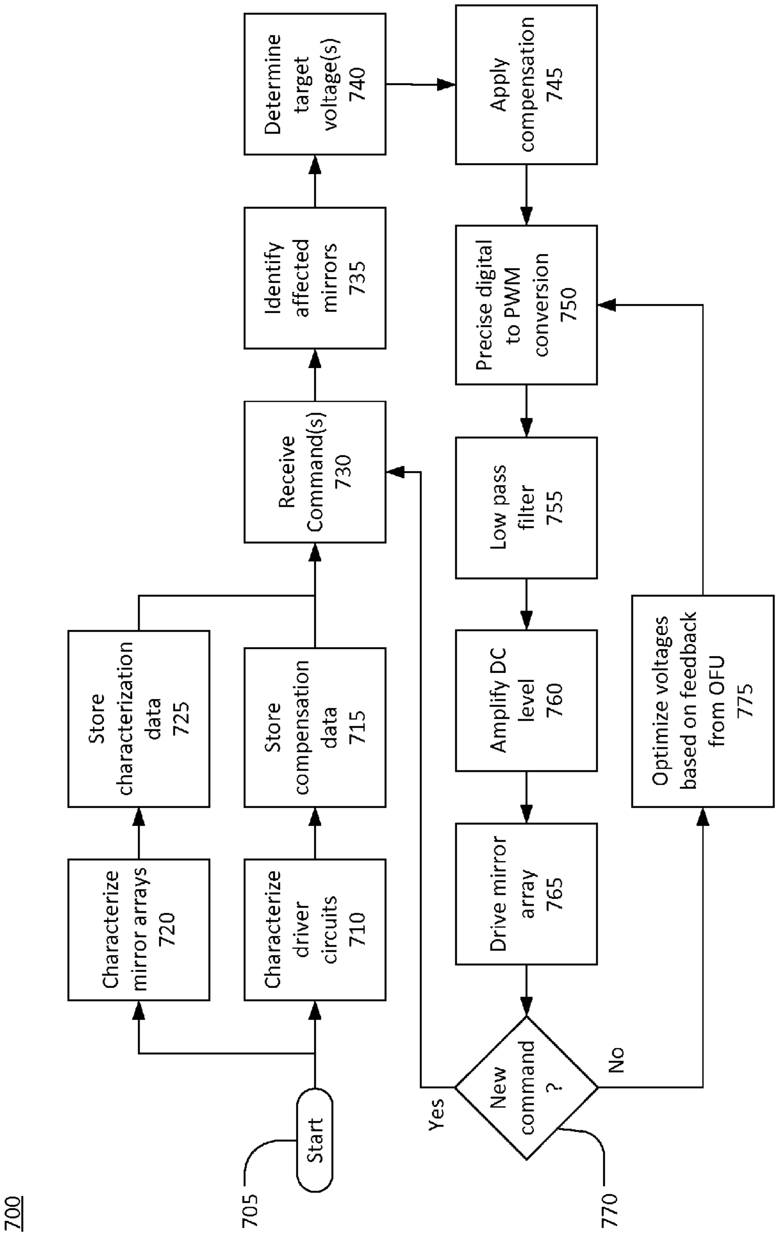
FIG. 7 is a flow chart of a process for operating an optical circuit switch.

FIG. 7 shows a flow chart of a process 700 for operating an optical circuit switch such as the optical circuit switch 100, 200, or 400. The process 700 may start at 705 and may continue as long as the optical circuit switch is in operation. For ease of discussion, the process 700 is shown as a series of sequential actions. However, multiple instantiations of the process 700 may run concurrently. Each of the multiple instantiations may perform different actions at the same time. For example, commands received at different times may be processed by different instantiations of the process 700.

At 710 a plurality of driver circuits used in the optical circuit switch may be characterized. Characterization may be done during manufacture, before or after the driver circuits are integrated into the optical circuit switch. For example, the output voltage of each driver circuit may be measured for a range of digital input values at a nominal temperature and, optionally, at multiple temperatures. Ideally, the output voltage should be a predetermined multiple of the digital input value. In practice, each driver circuit may have offset, gain, and linearity errors that can be quantified from the measurements performed at 710. Each driver circuit may have two selectable outputs, which may be characterized separately.

The measurement performed at 710 may be used to develop compensation data that is stored at 715. The compensation data may be, for example, in the form of a lookup table listing, for each driver circuit, a set of desired output voltages and a digital input value necessary to generate each desired output voltage. When the driver circuits have been characterized at multiple temperatures, multiple lookup tables may be provided for different temperatures or temperature ranges.

The compensation data stored at 715 may be, for further example, a set of coefficients, for each driver circuit, to be used in an algorithm that calculates the required digital input value necessary to provide a desired output voltage. The compensation data may be in some other format. In cases where the driver circuits have two selectable outputs, separate compensation data may be stored for each output. When the driver circuits have been characterized at multiple temperatures, the algorithm to calculate the required digital input value may include temperature-dependent terms.

The compensation data stored 715 may be in some other format. Compensation data may be stored at 715 in a nonvolatile memory such as, for example, a semiconductor flash memory or a magnetic disc memory. Compensation data may be stored in a memory associated with a controller of the optical circuit switch. When the optical circuit switch has distributed architecture, such as the optical circuit switch 400, compensation data may be stored in one or more memories within driver circuit modules or may be distributed between memories within driver circuit modules and a controller. All necessary compensation data may be stored before the optical circuit switch is placed into service.

At 720 the mirrors within one or more mirrors arrays used in the optical circuit switch may be characterized. Characterization may be done during manufacture, before or after the mirror arrays are integrated into the optical circuit switch. For example, the rotation angle (or angles, for mirror elements rotatable on two axes) of each mirror may be measured for a range of voltage values at a nominal temperature and, optionally, at multiple temperatures. The mirror elements may be characterized in some other manner.

The measurement performed at 720 may be used to develop characterization data that is stored at 725. The characterization data may be, for example, a lookup table listing the measured angle-versus-voltage characteristics of each mirror element. This data may be subsequently used to calculate a set of voltages necessary to creation a connection between two specified ports of the optical circuit switch. The characterization data may be, for further example, in the form of a lookup table listing, for every combination of a mirror element in a first mirror array and a mirror element in a second mirror array, a set of voltages to create a connection between two ports of the optical circuit switch via the two selected mirror elements. The characterization data may be stored in some other format.

The characterization data stored at 725 may be stored in a nonvolatile memory such as, for example, a semiconductor flash memory or a magnetic disc memory. The characterization data may be stored, for example, in a memory associated with a controller of the optical circuit switch. All necessary characterization data may be stored before the optical circuit switch is placed into service or as the optical circuit switch is first placed into service. The actions at 720 and 725 may be performed before, after, or concurrently with the actions at 710 and 715.

After all compensation data and characterization data have been stored, the optical circuit switch may be placed in service by connecting ports of the optical circuit switch to respective optical circuits. The optical circuit switch may then receive one or more commands at 730. Typical commands may instruct the optical circuit switch to make one or more connections between ports or to break one or more existing connections.

At 735, the mirrors affected by the commands received at 730 may be determined. As previously described, to allow the use of mirrors arrays having a few nonfunctional elements, the mirrors arrays used within the optical switch may have surplus mirror elements such that the ports of the optical circuit switch can be directed to mirror element known to be functional. For example, at 735, the ports defined in the commands received at 730 may be input to a lookup table to identify the mirror elements affected by the commands.

At 740, the characterization data stored at 725 may be used to determine a set of target voltages to be applied to electrodes associated with the mirrors identified at 735. The set of target voltages may be determined, for example, by calculating the required angular rotation to the identified mirrors and ten consulting a lookup table to determine the target voltages. The set of target voltage may be determined, for example, by consulting a table that lists the set of voltages necessary to make a connection via every possible pair of mirrors. The set of target voltages may be determined in some other manner.

At 745, the compensation data stored at 715 may be applied to the target voltages determined at 740. Applying the compensation data may involve inputting the target voltages from 740 to a lookup table or equation to determine a set of compensated voltage values. The compensated voltage values may be values that, when input to the driver circuits associated with the mirrors identified at 735, will result in the target voltages being applied to the appropriate electrodes to cause the desired mirror rotation.

At 750, the set of compensated voltage values from 745 may be individually and precisely converted into pulse-width modulated (PWM) signals. In this context, "precisely converted" means converted such that both the duty factor and the amplitude of the PWM signals are precisely controlled. The precision of the duty factor of the PWM signals may be set by the precision (i.e. the number of bits) of the compensated digital voltage values from 745. The amplitude of the PWM signals may be set, as previously described, by a precision voltage reference circuit.

At 755, the PWM signals from 750 may be low pass filtered to provide a DC average value for each PWM signal. The DC average values may be amplified at 760, for example using amplifier circuits such the amplifier 600. The amplified DC values from 760 may be applied to the appropriate electrodes of the mirror arrays at 765 to implement the command or commands received at 730.

At 770, a determination may be made if one or more new commands are available. When no new commands have been received, the voltage applied to the mirror arrays may be optimized at 775 based on feedback from an optical feedback unit (OFU). The OFU, may, for example directly measure the angles of the mirrors in the mirror arrays and provide feedback indicative of errors in the angular positions of some or all mirrors. The OFU may, for further example, indirectly measure the mirrors positions by monitoring the insertion loss of optical connection through the optical circuit switch. The OFU may function in some other manner. In any case, the action at 775 may result in optimized digital voltages values being provided for digital to PWM conversion at 750. In the absence of new commands, the process 700 may continue the actions from 750 to 775 cyclically.

When a determination is made at 770 that one or more new commands are available, the actions from 730 to 765 may be repeated, but only with respect to the ports and mirrors affected by the new commands. Mirrors not affected by new commands may remain under control of the cyclic process from 750 to 775. The process 700 may continue cyclically as long as the optical circuit switch is operational.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A driver circuit to drive a micro-electro-mechanical system (MEMS) comprising:

a converter to convert a digital input value into a pulse-width modulated signal having a precise amplitude;

a low pass filter to extract an average DC component of the pulse-width modulated signal; and an amplifier to amplify the average DC component to provide an output voltage to drive an electrode of the MEMS.

2. The driver circuit of claim 1, wherein the converter includes a precision voltage reference circuit to set the amplitude of the pulse-width modulated signal.

3. The driver circuit of claim 2, wherein the pulse-width modulated signal is output from a buffer circuit powered from the precision voltage reference circuit.

4. The driver circuit of claim 1, wherein the amplifier includes a switch to selectively direct the output voltage to a first output or a second output, the first output to drive a first electrode of the MEMS and the second output to drive a second electrode of the MEMS.

5. The driver circuit of claim 4, wherein the amplifier further includes a feedback circuit to provide a feedback signal derived from the selected one of the first output and the second output.

6. The driver circuit of claim 5, wherein the amplifier has a non-inverting input to receive the average DC component and an inverting input to receive the feedback signal.

7. The driver circuit of claim 4, wherein the switch selectively directs the output voltage to the first output or the second output responsive to a sign bit of the digital input value.

8. The driver circuit of claim 1, further comprising:

an error compensator to generate the digital input value based on a digital target voltage value, wherein the error compensator compensates for one or more of an offset error, a gain error, and a linearity error of the combined converter, low pass filter, and amplifier.

9. The driver circuit of claim 8, wherein the error compensator comprises a memory storing compensation data.

10. The driver circuit of claim 9, wherein the compensation data comprises a lookup table.

11. The driver circuit of claim 9, wherein the error compensator comprises a processor that derives the digital input value from the digital target voltage value based on an equation, and the compensation data comprises one or more coefficients for use in the equation.

12. The driver circuit of claim 9, wherein the compensation data is derived from measurements performed on the combined converter, low pass filter, and amplifier.

13. A method of driving a micro-electro-mechanical system (MEMS) device, comprising:

converting a digital input value into a pulse-width modulated signal having a precise amplitude;

filtering the pulse-width modulated signal to extract an average DC component;

amplifying the average DC component to provide an output voltage; and driving an electrode of the MEMS device with the output voltage.

14. The method of claim 13, wherein converting a digital input value into a pulse-width modulated signal having a precise amplitude comprises:

setting the amplitude of the pulse-width modulated signal with a precision voltage reference circuit.

15. The method of claim 14, wherein setting the amplitude of the pulse-width modulated signal with a precision voltage reference circuit comprises:

outputting the pulse-width modulated signal from a buffer circuit powered from the precision voltage reference circuit.

16. The method of claim 13, wherein amplifying the average DC component to provide an output voltage comprises:

selectively directing the output voltage to a first output or a second output, the first output coupled to a first electrode of the MEMS device and the second output coupled to a second electrode of the MEMS device.

17. The method of claim 16, wherein selectively directing the output voltage to a first output or a second output comprises:

directing the output voltage to the first output or the second output responsive to a sign bit of the digital input value.

18. The method of claim 13, further comprising:

compensating for one or more of an offset error, a gain error, and a linearity error of the combined converter, low pass filter, and amplifier.

19. The method of claim 18, wherein compensating for one or more of an offset error, a gain error, and a linearity error comprises:

using a lookup table to convert a digital target voltage value into the digital input value.

20. The method of claim 18, wherein compensating for one or more of an offset error, a gain error, and a linearity error comprises:

deriving the digital input value from a digital target voltage value based on an equation.

* * * * *